United States Patent
Bi et al.

(10) Patent No.: US 10,957,601 B2
(45) Date of Patent: Mar. 23, 2021

(54) SELF-ALIGNED FIN RECESSES IN NANOSHEET FIELD EFFECT TRANSISTORS

(71) Applicant: INTERNATIONAL BUSINESS MACHINES CORPORATION, Armonk, NY (US)

(72) Inventors: Zhenxing Bi, Niskayuna, NY (US); Kangguo Cheng, Schenectady, NY (US); Wenyu Xu, Albany, NY (US); Xin Miao, Guilderland, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/157,588

(22) Filed: Oct. 11, 2018

(65) Prior Publication Data

US 2020/0118881 A1 Apr. 16, 2020

(51) Int. Cl.
| | |
|---|---|
| H01L 21/8234 | (2006.01) |
| H01L 29/66 | (2006.01) |
| H01L 29/78 | (2006.01) |
| H01L 27/088 | (2006.01) |
| H01L 29/06 | (2006.01) |
| H01L 21/3065 | (2006.01) |
| H01L 29/51 | (2006.01) |
| H01L 21/02 | (2006.01) |

(52) U.S. Cl.
CPC ........ *H01L 21/823431* (2013.01); *H01L 21/02647* (2013.01); *H01L 21/3065* (2013.01); *H01L 27/0886* (2013.01); *H01L 29/0673* (2013.01); *H01L 29/517* (2013.01); *H01L 29/6681* (2013.01); *H01L 29/66545* (2013.01); *H01L 29/66553* (2013.01); *H01L 29/785* (2013.01)

(58) Field of Classification Search
CPC ......... H01L 29/0673; H01L 21/823431; H01L 21/02647; H01L 29/6681; H01L 29/785; H01L 29/66583; H01L 27/0886; H01L 21/823418
See application file for complete search history.

(56) References Cited

U.S. PATENT DOCUMENTS

| | | | | |
|---|---|---|---|---|
| 5,457,879 | A * | 10/1995 | Gurtler | ................... H01L 24/16 438/108 |
| 8,680,626 | B2 * | 3/2014 | Smayling | ........ H01L 21/823475 257/401 |
| 9,246,003 | B2 | 1/2016 | Cheng et al. | |
| 9,281,378 | B2 | 3/2016 | Ching et al. | |
| | | (Continued) | | |

OTHER PUBLICATIONS

L. Czornomaz et al., Confined Epitaxial Lateral Overgrowth (CELO): A Novel Concept for Scalable Integration of CMOS-compatible InGaAs-on-insulator MOSFETs on Large-Area Si Substrates, 2015 Symposium on VLSI Technology Digest of Technical Papers, Jun. 2015.

*Primary Examiner* — Tuan A Hoang
(74) *Attorney, Agent, or Firm* — Tutunjian & Bitetto, P.C.; Douglas Pearson

(57) ABSTRACT

Semiconductor devices and methods of forming the same include etching a stack of alternating channel and sacrificial layers to form a fin. The etch depth is controlled by a signal layer embedded in a substrate under the stack. Source and drain regions are formed on ends of the channel layers. The sacrificial layers are etched away and a gate stack is formed over and between the channel layers.

15 Claims, 6 Drawing Sheets

(56) References Cited

U.S. PATENT DOCUMENTS

| | | | |
|---|---|---|---|
| 9,324,812 B2* | 4/2016 | Yang | H01L 29/0847 |
| 9,362,355 B1* | 6/2016 | Cheng | H01L 29/66742 |
| 9,761,722 B1 | 9/2017 | Jagannathan et al. | |
| 9,812,524 B2 | 11/2017 | Glass et al. | |
| 9,881,998 B1 | 1/2018 | Cheng et al. | |
| 9,947,591 B2 | 4/2018 | Merckling et al. | |
| 9,947,804 B1* | 4/2018 | Frougier | H01L 29/78696 |
| 9,984,936 B1 | 5/2018 | Xie et al. | |
| 9,997,519 B1 | 6/2018 | Bao et al. | |
| 10,032,911 B2* | 7/2018 | Then | H01L 27/088 |
| 2008/0251880 A1 | 10/2008 | Cohen et al. | |
| 2015/0236248 A1* | 8/2015 | Deshpande | H01L 27/222 |
| | | | 438/3 |
| 2018/0175163 A1* | 6/2018 | Barraud | H01L 29/78696 |

* cited by examiner

SELF-ALIGNED FIN RECESSES IN NANOSHEET FIELD EFFECT TRANSISTORS

BACKGROUND

Technical Field

The present invention generally relates to semiconductor device fabrication and, more particularly, to the use of an embedded etch stop for forming fin recesses.

Description of the Related Art

Fin field effect transistors (finFETs) are semiconductor devices that use fins of semiconductor material as their structural basis. A further evolution of the finFET is a nanosheet or nanowire device that uses one or more vertically arranged layers of semiconductor material formed from an initial fin. Forming these structures poses a challenge, particularly in nanosheet devices, because it is difficult to control a depth of the directional etch that forms the fins. Variations in the structure, including semiconductor thickness, gate height, and hardmask thickness, make it difficult to achieve a uniform recess between the fins.

SUMMARY

A method of forming a semiconductor device includes etching a stack of alternating channel and sacrificial layers to form a fin. The etch depth is controlled by a signal layer embedded in a substrate under the stack. Source and drain regions are formed on ends of the channel layers. The sacrificial layers are etched away and a gate stack is formed over and between the channel layers.

A method forming a semiconductor device includes forming signal layer pads on a base semiconductor layer. Additional semiconductor material is epitaxially grown from exposed portions of the base semiconductor layer between the signal pads to completely enclose the signal layer pads and to form a substrate with an embedded signal layer. A stack of alternating channel and sacrificial layers is formed on the substrate. The stack is anisotropically etched to form a plurality of fins. Exposure of the signal layer pads by the anisotropic etch is detected and the anisotropic etch is halted responsive to the detection of the exposure of the signal layer. Dielectric is deposited in recesses between the fins to contact the signal layer pads to form a structure under at least one of the plurality of fins that has a u-shaped cross-section. Source and drain regions are formed on ends of the channel layers. Inner spacers are formed on sidewalls of the sacrificial layers. The sacrificial layers are etched away and a gate stack is formed over and between the channel layers.

A semiconductor device includes a substrate having an embedded signal layer. A column of vertically aligned channel layers are formed over the substrate. Source and drains structures are formed on sidewalls of the column of vertically aligned channel layers. A gate stack is formed over and intercalated within the column of vertically aligned channel layers.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Embodiments of the present invention form fins using a directional etch. An etch stop or signal layer is embedded into a substrate, underneath a stack of nanosheet layers. When a directional etch is applied to the stack of layers, the etch proceeds until the signal layer is uncovered and detected. The etch is then halted, ensuring uniformity in the fin recess process.

Figure 1:
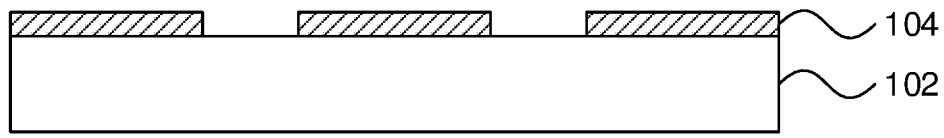
FIG. 1 is a cross-sectional diagram of a step in the formation of a semiconductor device where signal layer pads are formed on a base semiconductor layer in accordance with an embodiment of the present invention.

Referring now to the drawings in which like numerals represent the same or similar elements and initially to FIG. 1, a cross-sectional view of a step in the formation of a nanosheet device is shown. Thin signal layer pads 104 are formed on a semiconductor substrate 102. It should be understood that the signal layer pads 104 may be formed from any appropriate dielectric material, but it is specifically contemplated that silicon nitride may be used. The signal layer pads 104 can be formed by depositing a uniform layer of material on the substrate 102 and subsequently patterning the pads with a width that exceeds a gate width of the device to be formed. For example, a width of the signal layer pads 104 may be between about 50 nm and about 100 nm and a thickness of the signal layer pads 104 may be between about 5 nm and about 20 nm.

The semiconductor substrate 102 may be a bulk-semiconductor substrate. In one example, the bulk-semiconductor substrate may be a silicon-containing material. Illustrative examples of silicon-containing materials suitable for the bulk-semiconductor substrate include, but are not limited to, silicon, silicon germanium, silicon germanium carbide, silicon carbide, polysilicon, epitaxial silicon, amorphous silicon, and multi-layers thereof. Although silicon is the predominantly used semiconductor material in wafer fabrication, alternative semiconductor materials can be employed, such as, but not limited to, germanium, gallium arsenide, gallium nitride, cadmium telluride, and zinc selenide. Although not depicted in the present figures, the semiconductor substrate 102 may also be a semiconductor on insulator (SOI) substrate.

Figure 2:
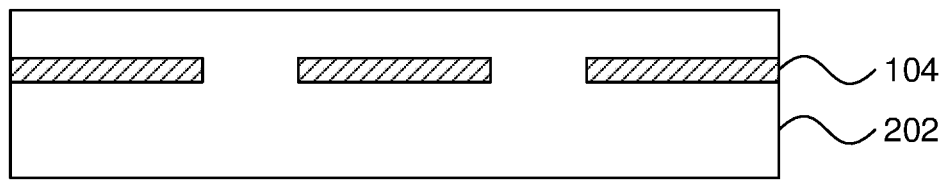
FIG. 2 is a cross-sectional diagram of a step in the formation of a semiconductor device where additional semiconductor material is grown over the signal layer pads in accordance with an embodiment of the present invention.

Referring now to FIG. 2, a cross-sectional view of a step in the formation of a nanosheet device is shown. Additional semiconductor material is grown from the exposed surfaces of the semiconductor substrate 102. The additional material grows laterally over the signal layer pads 104, covering them completely. The semiconductor material can then be polished down to an appropriate thickness in a chemical mechanical planarization (CMP) process. CMP is performed using, e.g., a chemical or granular slurry and mechanical force to gradually remove upper layers of the device. The result is a signal-embedded substrate 202 that has a layer of material above the signal layer pads 104 with a thickness selected to correspond to the fin recess depth. A gap between the signal layer pads 104 is selected to be large enough to allow the epitaxial material to fully cover the signal layer pads 104.

The term "epitaxial growth" means the growth of a semiconductor material on a deposition surface of a semiconductor material, in which the semiconductor material being grown has substantially the same crystalline characteristics as the semiconductor material of the deposition surface. The term "epitaxial material" denotes a material that is formed using epitaxial growth. In some embodiments, when the chemical reactants are controlled and the system parameters set correctly, the depositing atoms arrive at the deposition surface with sufficient energy to move around on the surface and orient themselves to the crystal arrangement of the atoms of the deposition surface. Thus, in some examples, an epitaxial film deposited on a {100} crystal surface will take on a {100} orientation.

Figure 3:
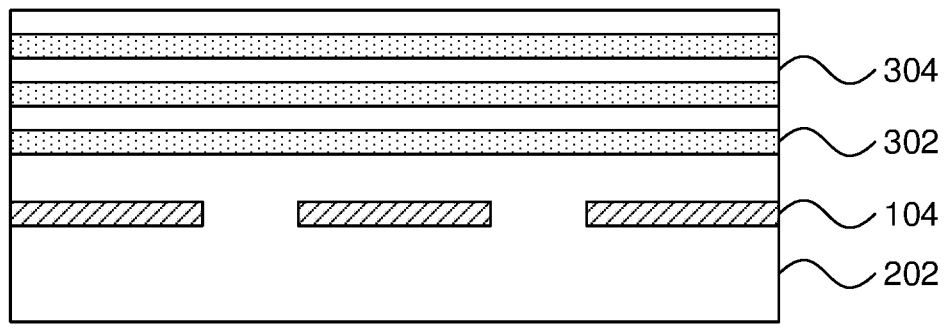
FIG. 3 is a cross-sectional diagram of a step in the formation of a semiconductor device where a stack of alternating channel and sacrificial layers is formed in accordance with an embodiment of the present invention.

Referring now to FIG. 3, a cross-sectional view of a step in the formation of a nanosheet device is shown. Alternating layers of sacrificial material 302 and channel material 304 are formed on the signal-embedded substrate 202. In one specific embodiment, it is contemplated that the layers of channel material 304 may have a thickness between about 5 nm and about 10 nm and that the layers of sacrificial material 302 may have a thickness between about 5 nm and about 10 nm.

In one example, the bulk-semiconductor substrate may be a silicon-containing material. Illustrative examples of silicon-containing materials suitable for the bulk-semiconductor substrate include, but are not limited to, silicon, silicon germanium, silicon germanium carbide, silicon carbide, polysilicon, epitaxial silicon, amorphous silicon, and multi-layers thereof. Although silicon is the predominantly used semiconductor material in wafer fabrication, alternative semiconductor materials can be employed, such as, but not limited to, germanium, gallium arsenide, gallium nitride, cadmium telluride, and zinc selenide. Although not depicted in the present figures, the semiconductor substrate 102 may also be a semiconductor on insulator (SOI) substrate.

It is specifically contemplated that the alternating layers 302 and 304 are formed from different materials that are selectively etchable with respect to one another. As used herein, the term "selective" in reference to a material removal process denotes that the rate of material removal for a first material is greater than the rate of removal for at least another material of the structure to which the material removal process is being applied. In one particular embodiment, the layers of sacrificial material 302 may be formed from, e.g., silicon germanium and the layers of channel material 304 may be formed from silicon. It is specifically contemplated that the alternating layers will be sequentially grown using an epitaxial growth process. It should be understood that alternate materials and formation processes are also contemplated.

Figure 4:
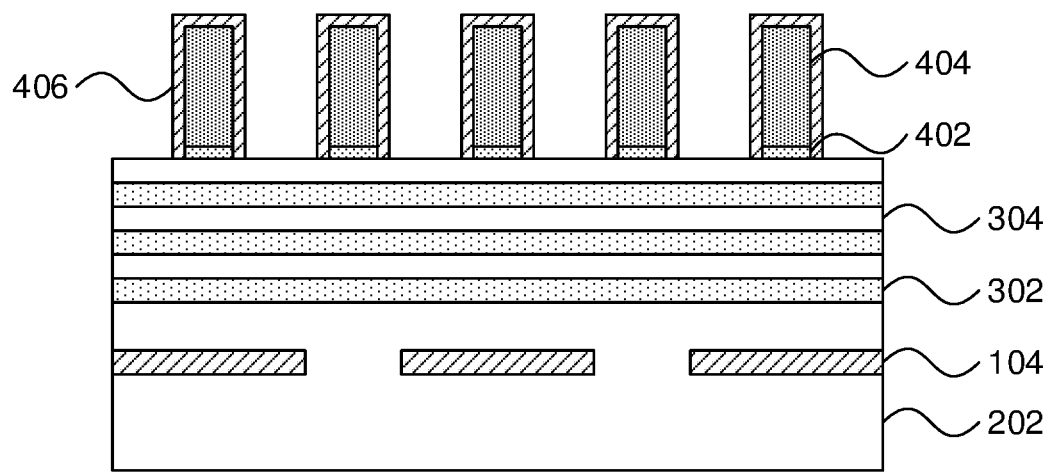
FIG. 4 is a cross-sectional diagram of a step in the formation of a semiconductor device where dummy gate structures are formed on the stack of alternating layers in accordance with an embodiment of the present invention.

Referring now to FIG. 4, a cross-sectional view of a step in the formation of a nanosheet device is shown. Dummy gate structures are formed on top of the stack of layers. In particular, a layer of dummy gate dielectric material and a layer of dummy gate material are formed on the topmost channel layer. The dummy gate dielectric material may be any appropriate material such as, e.g., a silicon oxide. The dummy gate material may be any appropriate material such as, e.g., polysilicon. The dummy gate layers are then patterned to form dummy gate dielectric 402 and dummy gates 404. Any appropriate process may be used to form these structures including the formation of a hardmask followed by an anisotropic etch. A spacer 406 is conformally formed over the dummy gates 404, including sidewalls thereof. Spacer material on the horizontal surfaces is removed using an anisotropic etch. In the embodiment shown, additional thickness on top of the dummy gates 404 remains as a result of the hardmask used for patterning, but it should be understood that other embodiments may not have any spacer material on the top surfaces of the dummy gates 404.

Figure 5:
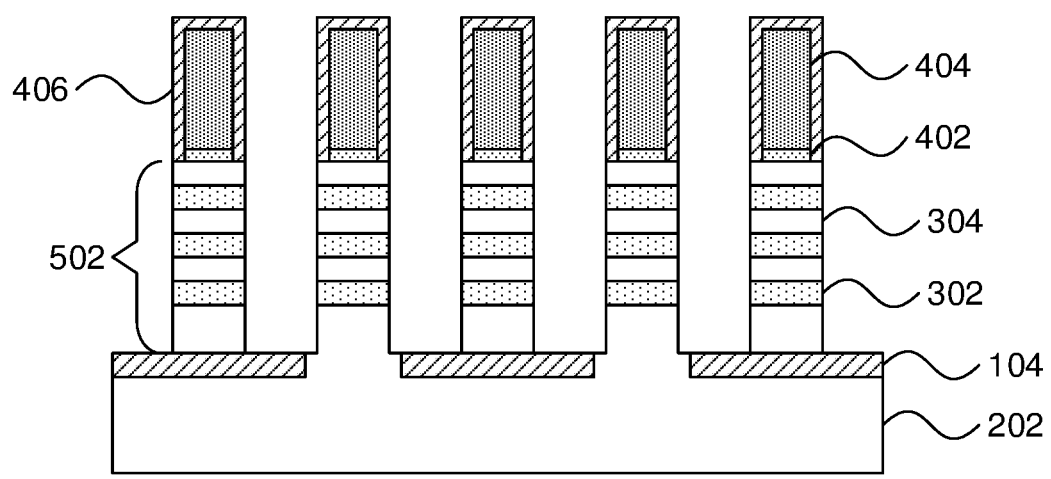
FIG. 5 is a cross-sectional diagram of a step in the formation of a semiconductor device where recesses are formed in the stack of alternating layers using the dummy gate structures as a mask, with the etch halting upon exposure of the signal layer pads, in accordance with an embodiment of the present invention.

Referring now to FIG. 5, a cross-sectional view of a step in the formation of a nanosheet device is shown. An anisotropic etch, such as a reactive ion etch (RIE) is used to form nanosheet or nanowire fins 502 from the stack of layers, etching down into the signal-embedded substrate 202 until the etch hits a signal layer pad 104. The exposure of the signal layer pad 104 is detected and the etch is halted, preventing any further removal of material. A bottommost layer of the fins 502 will have a thickness that is determined by the amount of substrate material above the signal layer pads 104.

RIE is a form of plasma etching in which during etching the surface to be etched is placed on a radio-frequency powered electrode. Moreover, during RIE the surface to be etched takes on a potential that accelerates the etching species extracted from plasma toward the surface, in which the chemical etching reaction is taking place in the direction normal to the surface. Other examples of anisotropic etching that can be used at this point of the present invention include ion beam etching, plasma etching or laser ablation.

As used herein, the term "nanosheet" refers to a structure that has a ratio of its cross-sectional width to its cross-sectional width greater than about 2:1, whereas the term "nanowire" refers to a structure that has a ratio of its cross-sectional width to its cross-sectional width less than about 2:1.

Detection of the signal layer pad 104 can be performed using any appropriate detection method including, e.g., laser endpoint detection and optical spectrometry. Laser endpoint detection operates by shining a laser into the recess during the etching process and measuring the reflected light. The laser beam reflects off of different layer interfaces, allowing for a measurement of a thickness of material above the signal layer pads 104. Optical spectrometry measures the emission or absorption spectrum of gas in the recess, which includes the material being removed from the substrate 202. When the etched material changes to include material from the signal layer pads 104, that means that the signal layer pads 104 have been exposed.

Figure 6:
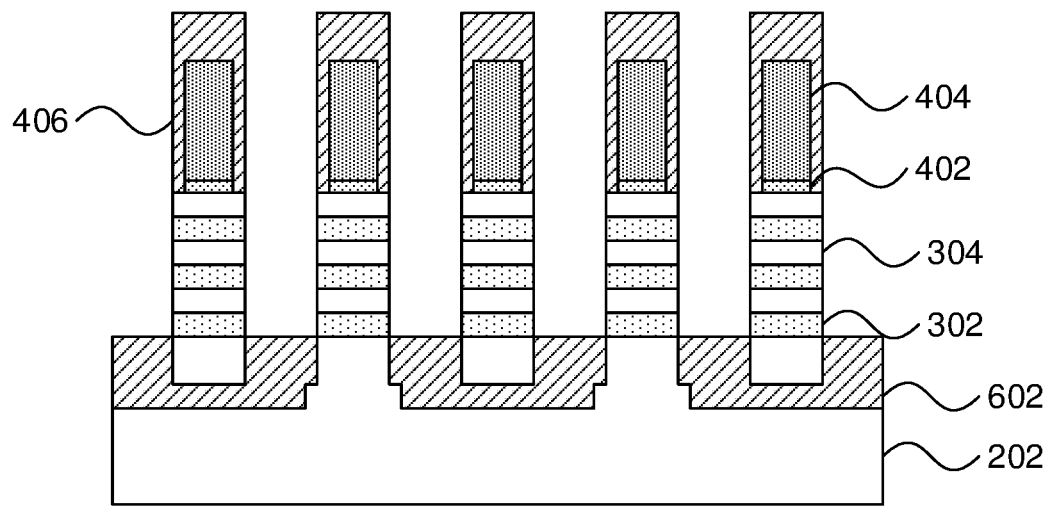
FIG. 6 is a cross-sectional diagram of a step in the formation of a semiconductor device where dielectric material is deposited in the recesses for bottom spacers in accordance with an embodiment of the present invention.

Referring now to FIG. 6, a cross-sectional view of a step in the formation of a nanosheet device is shown. Dielectric material is deposited to form bottom spacers 602. It is specifically contemplated that the dielectric material may be the same material as the signal layer pads 104, although other insulating materials may be used instead. The bottom spacers 602 thus combine with the signal layer pads 104 to form, in some cases, structures under the fins 502 that have a u-shaped cross-section.

Figure 7:
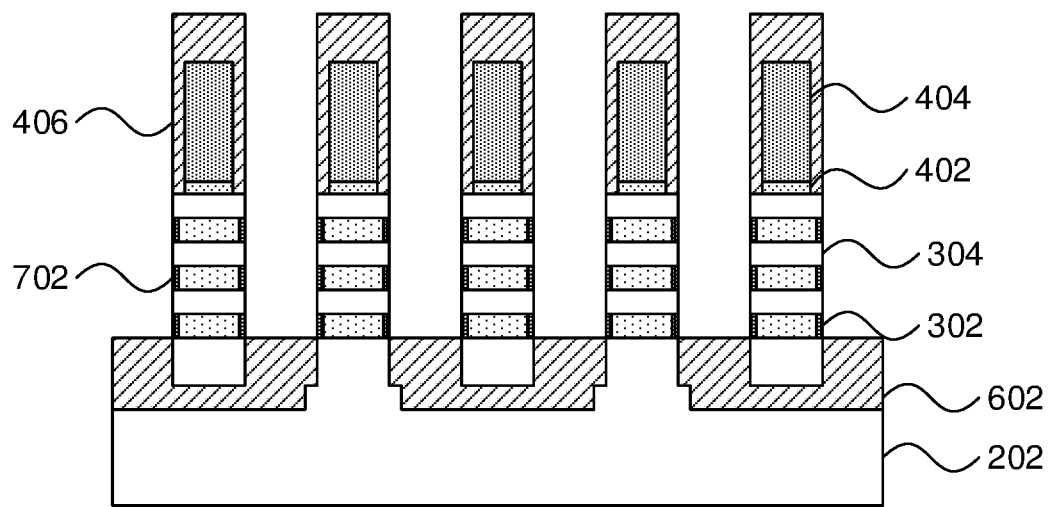
FIG. 7 is a cross-sectional diagram of a step in the formation of a semiconductor device where inner spacers are formed at ends of the sacrificial layers in accordance with an embodiment of the present invention.

Referring now to FIG. 7, a cross-sectional view of a step in the formation of a nanosheet device is shown. The sacrificial layers 302 are selectively etched back relative to the channel layers 304. Inner spacers 702 are then formed at the ends of the recessed sacrificial layers 302. The inner spacers 702 may be formed by any appropriate process including, e.g., conformally depositing a dielectric material and then anisotropically and selectively etching any of the dielectric material that is exposed. In an alternative embodiment, the inner spacers 702 can be formed by a self-limiting condensation process without recessing the sacrificial layers 302.

Figure 8:
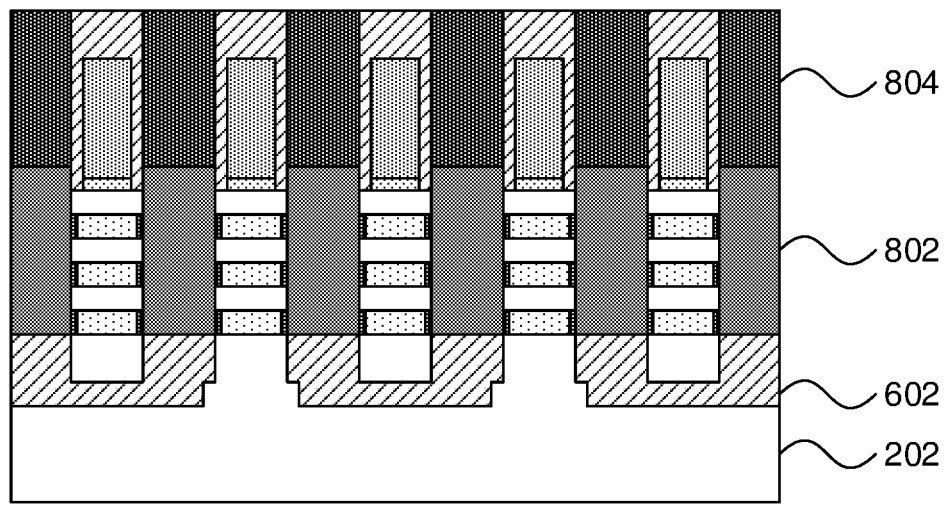
FIG. 8 is a cross-sectional diagram of a step in the formation of a semiconductor device where source and drain structures are grown from ends of the channel layers in accordance with an embodiment of the present invention.

Referring now to FIG. 8, a cross-sectional view of a step in the formation of a nanosheet device is shown. Source/drain regions 802 are epitaxially grown from ends of the channel layers 304 and may be formed from any appropriate doped semiconductor material. A passivating dielectric layer 804 is then formed over the source/drain regions 802 by any appropriate deposition process including, e.g., chemical vapor deposition (CVD), physical vapor deposition (PVD), atomic layer deposition (ALD), or gas cluster ion beam (GCIB) deposition, followed by a CMP that stops on the spacers 406.

CVD is a deposition process in which a deposited species is formed as a result of chemical reaction between gaseous reactants at greater than room temperature (e.g., from about 25° C. about 900° C.). The solid product of the reaction is deposited on the surface on which a film, coating, or layer of the solid product is to be formed. Variations of CVD processes include, but are not limited to, Atmospheric Pressure CVD (APCVD), Low Pressure CVD (LPCVD), Plasma Enhanced CVD (PECVD), and Metal-Organic CVD (MOCVD) and combinations thereof may also be employed. In alternative embodiments that use PVD, a sputtering apparatus may include direct-current diode systems, radio frequency sputtering, magnetron sputtering, or ionized metal plasma sputtering. In alternative embodiments that use ALD, chemical precursors react with the surface of a material one at a time to deposit a thin film on the surface. In alternative embodiments that use GCIB deposition, a high-pressure gas is allowed to expand in a vacuum, subsequently condensing into clusters. The clusters can be ionized and directed onto a surface, providing a highly anisotropic deposition.

Figure 9:
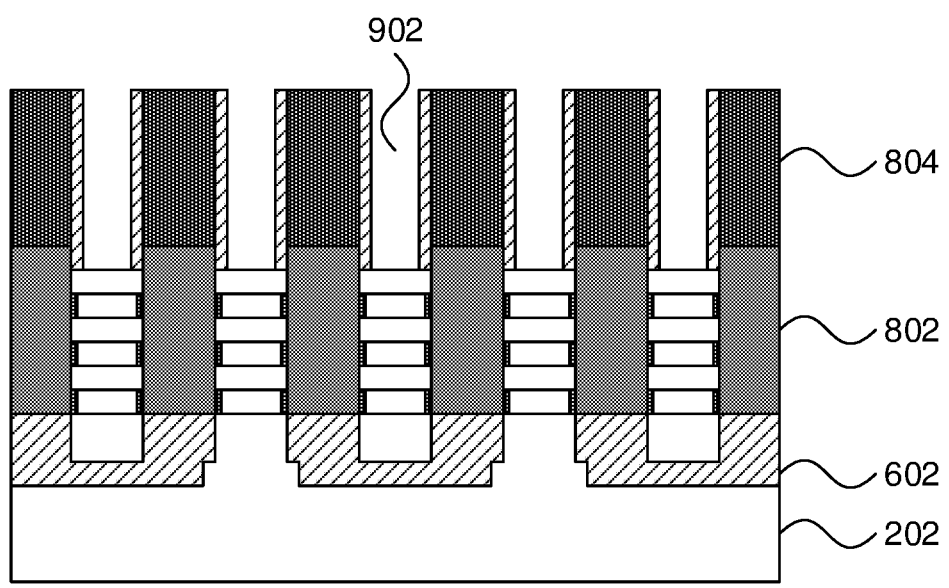
FIG. 9 is a cross-sectional diagram of a step in the formation of a semiconductor device where the dummy gate structures and sacrificial layers are etched away to expose top and bottom surfaces of the channel layers in accordance with an embodiment of the present invention.

Referring now to FIG. 9, a cross-sectional view of a step in the formation of a nanosheet device is shown. The dummy gate 404, dummy gate dielectric 402, and sacrificial layers 302 are etched away, leaving channel layers 304 exposed within gaps 902. Any appropriate isotropic etch can be used that will remove sacrificial material from between adjacent channel layers 304.

Figure 10:
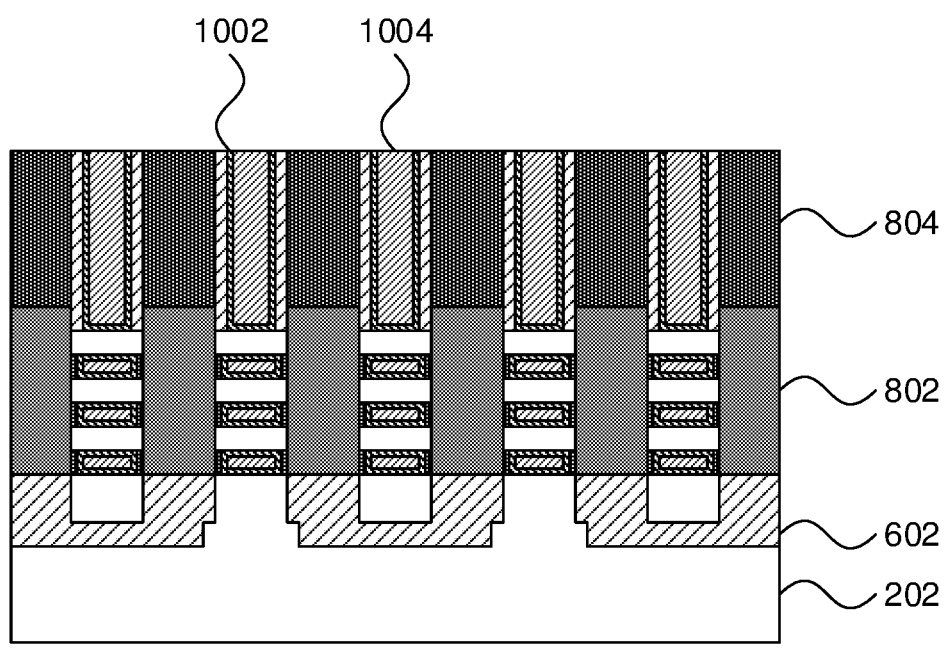
FIG. 10 is a cross-sectional diagram of a step in the formation of a semiconductor device where a gate stack is formed over and intercalated within the channel layers in accordance with an embodiment of the present invention.

Referring now to FIG. 10, a cross-sectional view of a step in the formation of a nanosheet device is shown. A gate stack is formed by conformally depositing a gate dielectric 1002 and a gate conductor 1004. Any appropriate dielectric material may be used for the gate dielectric 1002, including, for example, a high-k dielectric material. A work function metal (not shown) may optionally be deposited between the gate dielectric 1002 and the gate conductor 1004 to tune the device's electronic properties. The gate stack is thus formed over the channel layers and intercalated between them.

Examples of high-k dielectric materials include but are not limited to metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k material may further include dopants such as lanthanum and aluminum.

The gate conductor 1004 may be formed from any appropriate conductive metal such as, e.g., tungsten, nickel, titanium, molybdenum, tantalum, copper, platinum, silver, gold, ruthenium, iridium, rhenium, rhodium, and alloys thereof. The gate conductor 1004 may alternatively be formed from a doped semiconductor material such as, e.g., doped polysilicon.

At this stage, conductive contacts (not shown) can be formed to provide electrical connectivity to the source/drain regions 802 and to the gate conductors 1004. This can be accomplished by forming vias in the passivating dielectric 804 using an anisotropic etch and then depositing an appropriate conductive material in the vias.

It is to be understood that aspects of the present invention will be described in terms of a given illustrative architecture; however, other architectures, structures, substrate materials and process features and steps can be varied within the scope of aspects of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not ended to be limiting of embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements car features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer bet en the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Figure 11:
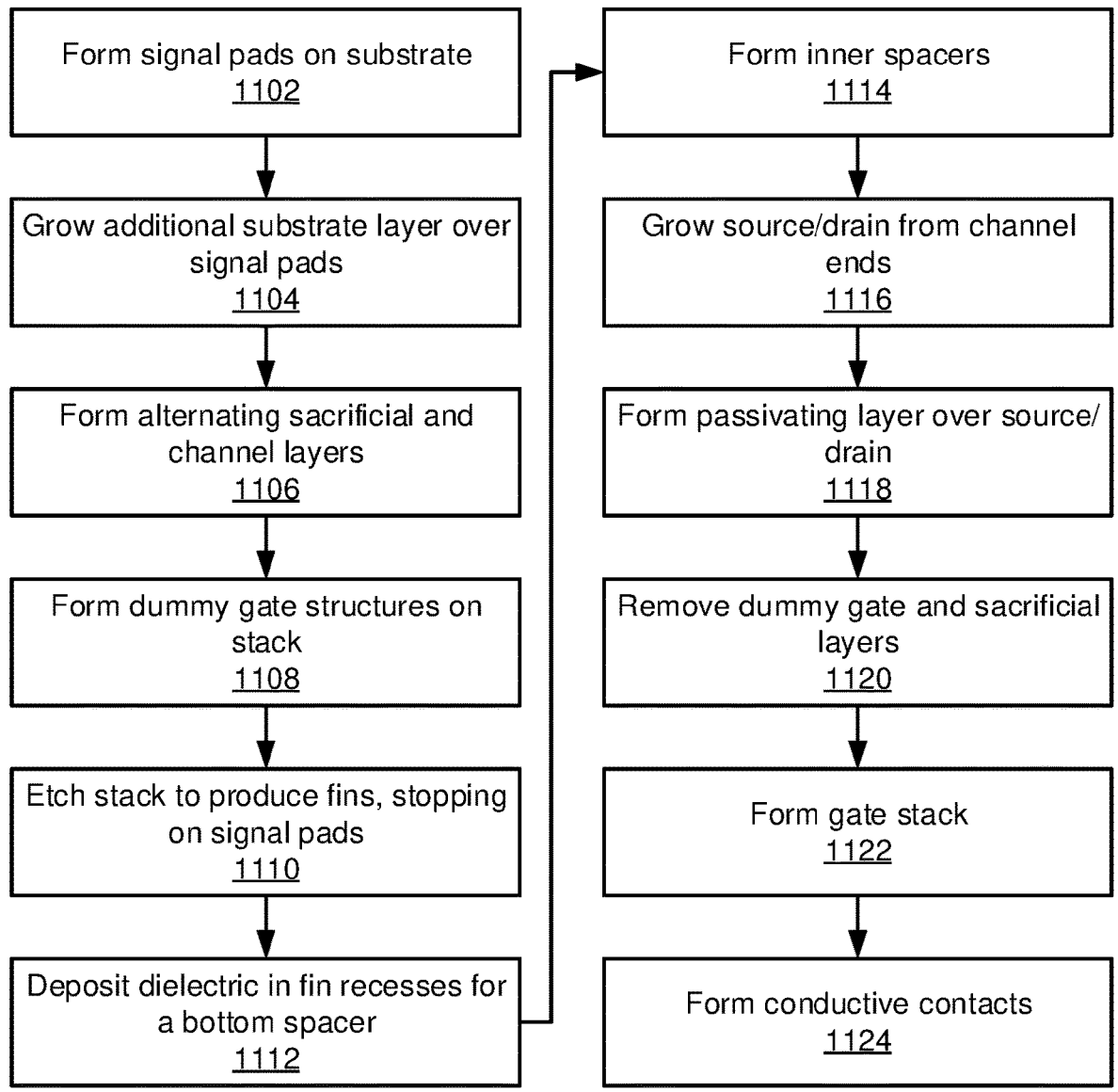
FIG. 11 is a block/flow diagram of a process for forming a semiconductor device with uniform and predictable recess depths between fins in accordance with an embodiment of the present invention.

Referring now to FIG. 11, a process for forming a nanosheet device is shown. Block 1102 forms signal layer pads 104 on a substrate 102. The signal layer pads 104 are formed from any appropriate material such as, e.g., silicon nitride, that will be detectable during a subsequent etch. Gaps are left between signal layer pads 104, exposing the underlying substrate 102. Additional substrate material is formed by, e.g., epitaxial growth, in block 1104. The grown material covers the signal layer pads 104 to form signal-embedded substrate 202.

Block 1106 forms alternating sacrificial layers 302 and channel layers 304 on the signal-embedded substrate 202 by, e.g., sequential steps of epitaxial growth. Block 1108 forms dummy gate structures on the stack of alternating layers and block 1110 uses the dummy gate structures as a mask to etch fins 502 from the stack of alternating materials. Block 1110 detects when the signal layer pads 104 have been exposed by the etch and stops the etching process at that point. Block 1112 deposits dielectric material in the recesses between the fins 502 for bottom spacer formation.

Block 1114 forms inner spacers on the sacrificial layers 302. This can be performed by, e.g., etching back the sacrificial layers 302 and conformally depositing a dielectric layer, then etching away any exposed material, or by converting exposed portions of the sacrificial layers 302 to a dielectric material through a condensation process. Block 1116 then grows source/drain structures 802 from exposed ends of the channel layers 304 through an epitaxial growth process.

Block 1118 forms a passivating layer 804 over the source/drain structures 802 by, for example, a flowable CVD process followed by a CMP that stops on the spacers 406. Block 1120 removes the dummy gate structures and the remaining sacrificial material from sacrificial layers 302 by respective etch processes, thereby exposing top and bottom surfaces of the channel layers 304. Block 1122 forms a gate stack in the gap 902 by depositing a gate dielectric layer 1002 and a gate conductor 1004. Block 1124 then finishes the device by forming conductive contacts to the source/drain structures 802 and to the gate conductor 1004, forming vias through the passivating layer 804 as needed.

Having described preferred embodiments of self-aligned fin recesses in nanosheet field effect transistors (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method of forming a semiconductor device, comprising:
    etching a stack of alternating channel and sacrificial layers to form a plurality of fins, wherein a depth of said etching is controlled by a signal layer embedded in a substrate under the stack;
    forming bottom spacers on the signal layer, from the same material as the signal layer, by filling in recesses between the plurality of fins, such that the bottom spacers and the signal layer merge into a single structure having a 'u'-shaped cross-section, wherein the signal layer has a width that extends underneath one fin of the plurality of fins and does not extend underneath neighboring fins of the plurality of fins;
    forming source and drain regions on ends of the channel layers;
    etching away the sacrificial layers; and
    forming a gate stack over and between the channel layers.

2. The method of claim 1, further comprising forming the substrate by forming a plurality of signal layer pads on a base semiconductor layer and forming additional semiconductor material over the signal layer pads, wherein the signal layer pads make up the embedded signal layer.

3. The method of claim 2, wherein forming the plurality of signal layer pads comprises patterning a layer of signal material on a surface of the base semiconductor layer, with gaps between adjacent signal layer pads.

4. The method of claim 3, wherein forming the additional semiconductor material over the signal layer pads comprises epitaxially growing the additional semiconductor material from exposed portions of the base semiconductor layer between the signal layer pads to completely enclose the signal layer pads.

5. The method of claim 2, wherein the signal layer pads have a width that is greater a width of the fins.

6. The method of claim 1, further comprising detecting exposure of the signal layer by the etch of the stack and halting the etch after said detection.

7. The method of claim 1, wherein the bottom spacers contact the signal layer to form a structure under at least one of the fins that has a u-shaped cross-section.

8. The method of claim 1, wherein the bottom spacers have a top surface that has a height that is the same as a height of a top surface of the substrate.

9. The method of claim 1, wherein a thickness of the signal layer is between 5 nm and 20 nm.

10. The method of claim 6, wherein detecting the exposure of the signal layer comprises optical spectrometry.

11. The method of claim 6, wherein detecting the exposure of the signal layer comprises laser endpoint detection.

12. A method of forming a semiconductor device, comprising:
    forming a plurality of signal layer pads on a base semiconductor layer;
    epitaxially growing additional semiconductor material from exposed portions of the base semiconductor layer between the signal pads to completely enclose the signal layer pads and to form a substrate with an embedded signal layer;
    forming a stack of alternating channel and sacrificial layers on the substrate;
    anisotropically etching the stack to form a plurality of fins, wherein each signal layer pad has a width that extends underneath a respective fin of the plurality of fins and does not extend underneath neighboring fins of the plurality of fins;
    detecting exposure of the signal layer pads by the anisotropic etch;
    halting the anisotropic etch responsive to the detection of the exposure of the signal layer;
    depositing dielectric to fill in recesses between the fins to contact the signal layer pads to form a structure under at least one of the plurality of fins that has a u-shaped cross-section;
    forming source and drain regions on sidewalls of the channel layers;
    forming inner spacers on ends of the sacrificial layers;
    etching away the sacrificial layers; and
    forming a gate stack over and between the channel layers.

13. The method of claim 12, wherein forming the signal layer pads comprises patterning a layer of signal material on a surface of the base semiconductor layer, with gaps between adjacent signal layer pads.

14. The method of claim 13, wherein the signal layer pads have a width that is greater than a width of the fins.

15. The method of claim 13, wherein the dielectric material formed in the recesses, between the plurality of fins, has a top surface with a height that is the same as a height of a top surface of the substrate.

* * * * *